(12) United States Patent
Schwerman (10) Patent No.: US 8,389,908 B2
(45) Date of Patent: Mar. 5, 2013

(54) SYSTEMS AND METHODS FOR SOURCING A HEATER

(75) Inventor: Paul Schwerman, Phoenix, AZ (US)

(73) Assignee: Honeywell International Inc., Morristown, NJ (US)

( * ) Notice: Subject to any disclaimer, the term of this patent is extended or adjusted under 35 U.S.C. 154(b) by 1060 days.

(21) Appl. No.: 12/368,780

(22) Filed: Feb. 10, 2009

(65) Prior Publication Data

US 2011/0174801 A1    Jul. 21, 2011

(51) Int. Cl.
 *H05B 1/02* (2006.01)
 *H03K 4/06* (2006.01)
 *G05F 1/00* (2006.01)

(52) U.S. Cl. .......................... 219/509; 327/131; 323/288

(58) Field of Classification Search .......... 219/490–494, 219/507–510; 327/131–134, 172–180; 323/282, 323/283, 288
See application file for complete search history.

(56) References Cited

U.S. PATENT DOCUMENTS

| | | | | |
|---|---|---|---|---|
| 3,676,698 | A | * | 7/1972 | Hunter ........................... 327/132 |
| 3,745,373 | A | * | 7/1973 | Jones et al. .................... 327/132 |
| 4,007,425 | A | | 2/1977 | Salisbury |
| 4,230,970 | A | * | 10/1980 | Potter et al. ................... 315/307 |
| 4,954,676 | A | | 9/1990 | Rankin |
| 5,859,506 | A | * | 1/1999 | Lemke ........................... 315/308 |
| 6,411,072 | B1 | | 6/2002 | Feldman |
| 2005/0167418 | A1 | | 8/2005 | Ferre Fabregas et al. |
| 2005/0180179 | A1 | | 8/2005 | Hirst |
| 2007/0170902 | A1 | | 7/2007 | Chen et al. |
| 2007/0262801 | A1 | * | 11/2007 | Renaud et al. ................. 327/172 |
| 2008/0165830 | A1 | * | 7/2008 | Tai ................................ 375/132 |
| 2008/0234875 | A1 | | 9/2008 | Nomura |
| 2010/0033261 | A1 | * | 2/2010 | Stevenson et al. ............. 332/109 |
| 2011/0109293 | A1 | | 5/2011 | Schwerman |

FOREIGN PATENT DOCUMENTS

WO    2005052713    6/2005

OTHER PUBLICATIONS

Schwerman, "Systems and Methods for Limiting Input Power and RMS Input Current Drawn From a DC Power Source", filed Nov. 10, 2009, Publisher: U.S. Appl. No. 12/616,083.
European Patent Office, "European Search Report", Jun. 1, 2010, Published in: EP.
U.S. Patent and Trademark Office, "Office Action", "U.S. Appl. No. 12/616,083", May 4, 2012, pp. 120.
European Patent Office, "Office Action", "from Foreign Counterpart of U.S. Appl. No. 12/368,780", Jun. 18, 2010, pp. 1-6, Published in: EP.

* cited by examiner

*Primary Examiner* — Sang Paik

(74) *Attorney, Agent, or Firm* — Fogg & Powers LLC (57) ABSTRACT

Systems and methods source a heating resistor to control temperature. For example, a sensor block assembly (SBA) heater controls the temperature of a MEMS device in a sensor block assembly. An exemplary embodiment generates a root mean square (RMS) pulse width modulation (PWM) control signal based upon an input voltage from a power source, controls a switch in accordance with the RMS PWM control signal; and sources a heater resistor from the power source in accordance with the controlling of the switch. Power to the heating resistor is controlled by the switch to provide a substantially constant value of power to the heating resistor for varying values of the input voltage.

20 Claims, 7 Drawing Sheets

SYSTEMS AND METHODS FOR SOURCING A HEATER

GOVERNMENT INTEREST

The present invention was made with support from the United States Government under contract number C-3009 awarded by Lockheed Martin Space Systems Company. The United States Government may have certain rights in the invention.

BACKGROUND OF THE INVENTION

A Micro-Electro-Mechanical Systems (MEMS) device is typically enclosed in a sensor block assembly (SBA) to facilitate mounting of the MEMS device in its application device. For example, a MEMS gyroscope or accelerometer may be used to determine angular rotation or acceleration, respectively, of the application device in which it is installed.

The MEMS device may be subject to severe temperature excursions when the application device is operating in the field. For example, if the application device is a satellite or space craft, the satellite or space craft will be subjected to extreme temperature variations. However, performance of the MEMS device varies as a function of temperature. It is particularly undesirable for the MEMS device to be subjected to changes in temperature.

Further, in addition to ambient temperature excursions, devices within the MEMS device and the SBA, including the SBA controller, generate heat while operating due to resistive loading losses. Such generated heat further complicates the maintenance of the MEMS device at a predefined temperature or within a predefined temperature range.

To prevent the MEMS device from exposure to cold temperatures, a heater may be physically coupled to, or implemented within, the sensor block assembly. As temperature of the application device decreases, the SBA heater will operate to maintain temperature of the MEMS device within a predefined temperature threshold.

However, the temperature control system of the SBA heater relies on an external power source, such as a battery. When a battery is used as the power source, output voltage of the battery changes as a function of temperature and/or use. For example, as power within the battery is consumed, the output voltage of the battery will decrease. As the battery is recharged, output voltage increases. Such changes in the output voltage of the battery affects the performance of the SBA heater.

The output power of a resistive type SBA heater equals the magnitude of the input voltage squared ($V_{IN}^2$), divided by the value of the heater resistor ($R_{HEATER}$), and times the duty factor (D), as illustrated by Equation 1 below. The duty factor corresponds to the period of time for which the input voltage ($V_{IN}$) is applied to the heater resistor ($R_{HEATER}$).

$$\text{Output Power} = [(V_{IN}^2)/(R_{HEATER})] * (D) \qquad \text{(Eq. 1)}$$

The SBA heater control system is configured to adjust the duty cycle so that the SBA heater maintains the operating temperature of the MEMS device at its predefined operating temperature (or within its predefined operating temperature range). However, the SBA heater control system response time is not instantaneous. For example, if the power supply voltage doubles, the output power increases by a factor of four until the SBA heater control system is able to decrease the duty cycle by a factor of four. During this period of time wherein the SBA heater control system adjusts the duty cycle, the SBA heater may heat the MEMS device above the desired predefined temperature (or temperature slew rate).

Accordingly, it is desirable to improve the ability of the SBA heater control system to respond more accurately to changes in the power source voltage so that the SBA heater is able to maintain the predefined temperature of the MEMS device.

SUMMARY OF THE INVENTION

Systems and methods of sourcing a heating resistor to control temperature are disclosed. An exemplary embodiment generates a root mean square (RMS) pulse width modulation (PWM) control signal based upon an input voltage from a power source, controls a switch in accordance with the RMS PWM control signal; and sources a heater resistor from the power source in accordance with the controlling of the switch. Power to the heating resistor is controlled by the switch to provide a substantially constant value of power to the heating resistor for varying values of the input voltage.

In accordance with further aspects, an exemplary embodiment includes a heating resistor, a switch coupled between a power source and the heating resistor, and a root mean square (RMS) pulse width modulation (PWM) controller coupled to the switch. The switch is configured to source the heating resistor at the input voltage from the power source. The RMS PWM controller is configured to generate a RMS PWM control signal to control the switch. The RMS PWM control signal operates the switch to provide power to the heating resistor at a first duty cycle corresponding to the magnitude of the first input voltage and operates the switch to provide power to the heating resistor at a second duty cycle corresponding to the magnitude of a second input voltage. Accordingly, the power provided to the heating resistor at the first duty cycle is substantially the same as the power provided to the heating resistor at the second duty cycle.

BRIEF DESCRIPTION OF THE DRAWINGS

Preferred and alternative embodiments are described in detail below with reference to the following drawings.

DETAILED DESCRIPTION OF THE PREFERRED EMBODIMENT

Figure 1:
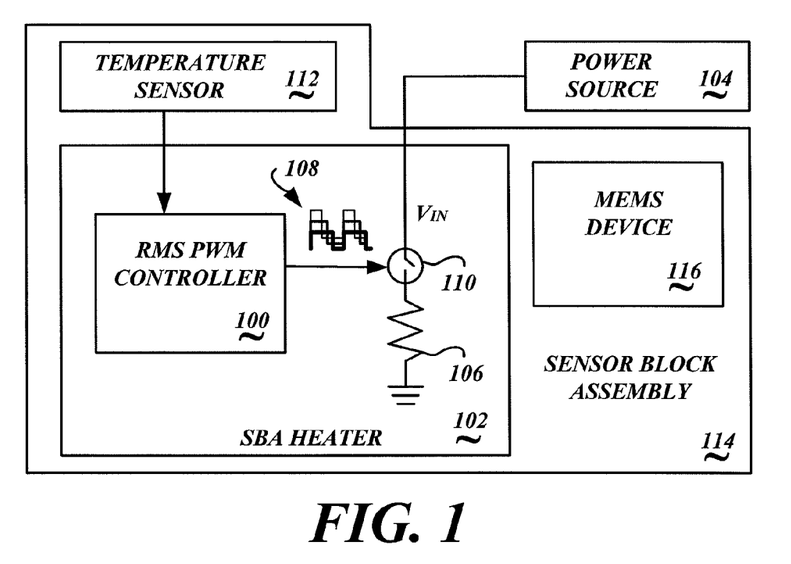
FIG. 1 is a block diagram of an embodiment of the RMS PWM controller in a SBA heater.

FIG. 1 is a block diagram of an embodiment of the root mean square (RMS) pulse width modulation (PWM) controller 100 in a sensor block assembly (SBA) heater 102. An exemplary embodiment of the RMS PWM controller 100, for a given demand level, controls the power received from a power source 104 which is delivered to a heating resistor 106 in a SBA heater 102 by using a RMS PWM control signal 108 that controls a switch 110 coupled to the heating resistor 106. The RMS PWM control signal 108 operates the switch 110 to provide power to the heating resistor 106 at a duty cycle corresponding to a magnitude of the input voltage ($V_{IN}$) supplied from the power source 104. Accordingly, for a given demand level, embodiments of the RMS PWM controller 100 maintain a substantially constant amount of power to the heating resistor 106 as the input voltage ($V_{IN}$) varies by controlling the duty cycle. The duty cycle is controlled by the RMS PWM control signal 108 which actuates the switch 110.

A temperature sensor 112 senses temperature of the sensor block assembly (SBA) 114. When the sensed temperature is less than a predefined temperature threshold, the RMS PWM controller 100 is enabled to control the switch 110. The switch 110 couples the heating resistor 106 and the power source 104 so that the heating resistor 106 is sourced at a substantially constant value of power for varying values of the magnitude of the input voltage ($V_{IN}$) supplied from the power source 104 in accordance with the RMS PWM control signal 108. Accordingly, the RMS PWM controller 100 controls temperature of a Micro-Electro-Mechanical Systems (MEMS) device 116 residing in the SBA 114.

Figure 2:
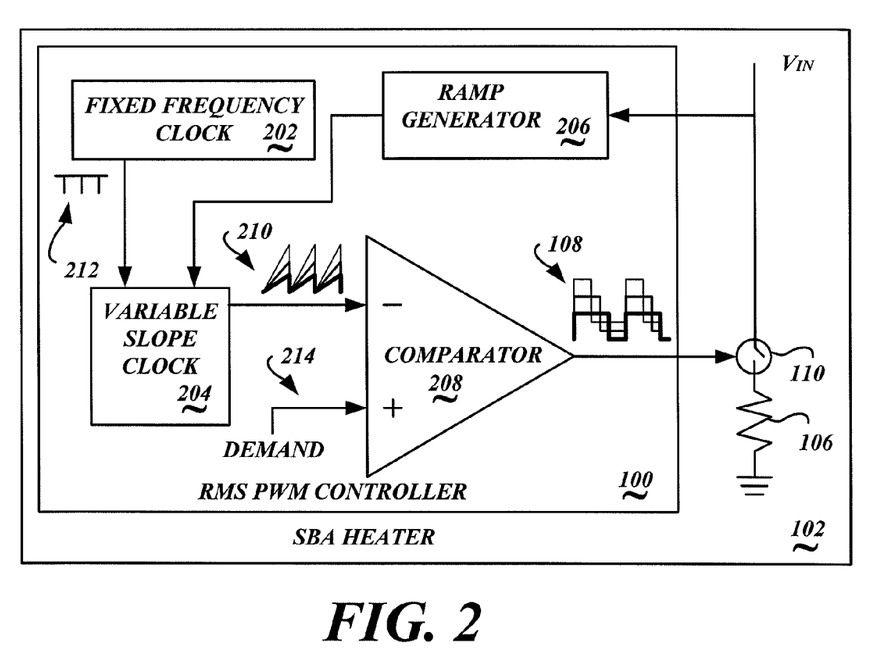
FIG. 2 is a block diagram of an embodiment of the RMS PWM controller.

FIG. 2 is a block diagram of an embodiment of the RMS PWM controller 100. The RMS PWM controller 100 comprises a fixed frequency clock 202, a variable slope clock 204, a ramp generator 206, and a comparator 208.

The ramp generator 206 receives a voltage from the power source 104. Based upon the input voltage ($V_{IN}$) from the power source 104, the ramp generator 206 generates and communicates a control signal to the variable slope clock 204 which sets the slope of the variable ramp control signal 210. In an exemplary embodiment, the slope of the control signal output from the ramp generator 206 corresponds to the magnitude of the input voltage $V_{IN}$ minus an offset voltage (K), multiplied by a gain (g), and divided by the clock capacitance ($C_{CLK}$). Equation 2 generally describes the ramped control signal output from the ramp generator 206.

$$\text{Slope}=dv/dt=g*(V_{IN}-K)/C_{CLK} \qquad \text{(Eq. 2)}$$

The output control signal of the ramp generator 206 may be linear or nonlinear through suitable modification of Equation 2. For example, an exponential output control signal may be based upon a combination of coupled resistors (R) and capacitors (C) which define an RC slope. Further, some embodiments may employ a ramp rate with different slopes at predefined break points.

The fixed frequency clock 202 generates and communicates a clock control signal 212 to the variable slope clock 204 which sets the operating frequency of the variable ramp control signal 210 of the variable slope clock 204. For example, the clock control signal 212 may reset timing capacitors (not shown) of the variable slope clock 204 to a known voltage at the end of each clock cycle.

The variable ramp control signal 210 output from the variable slope clock 204 is input to the comparator 208. A demand signal 214 is also input to the comparator 208. The demand signal corresponds to a predefined value. The demand function may be a function of the temperature sensor 112. When the variable ramp control signal 210 is less than the demand signal 214, the output of the comparator 208 is a logical high such that the switch 110 is actuated to a closed position, thereby coupling the heating resistor 106 from the power source 104. When the variable ramp control signal 210 is equal to or greater than the demand signal 214, the output of the comparator 208 is a logical low such that the switch 110 is actuated to an opened position, thereby decoupling the heating resistor 106 from the power source 104.

When the magnitude of the input voltage ($V_{IN}$) supplied from the power source 104 is relatively high, the slope of the variable ramp control signal 210 is set relatively high. When the magnitude of the input voltage ($V_{IN}$) supplied from the power source 104 is relatively low, the slope of the variable ramp control signal 210 is set relatively low. Accordingly, the comparator 208 will transition from a logical high to a logical low more quickly with a higher slope of the variable ramp control signal 210. When the clock control signal 212 resets the variable slope clock 204, the comparator 208 transitions back to the logical high such that the switch 110 closes. Accordingly, "on" time when the switch 110 is closed is relatively less with higher input voltages ($V_{IN}$) than the "on" time with lower input voltages ($V_{IN}$). Thus, changing the slope of the variable ramp control signal 210 effectively changes the "on" time of the switch, thereby resulting in the RMS PWM control signal 108.

In alternative embodiments, additional and/or different components may be used which have different logical functionality, such as the comparator 208 and/or the switch 110. For example, the switch 110 and comparator 208 may act cooperatively to close the switch 110 when the output of the comparator 208 is a logical low. Alternatively, the switch 110 may be placed in the ground leg of the resistor 106.

Embodiments of the RMS PWM controller 100 are operable to dynamically control the RMS power supplied to the heating resistor 106 as the input voltage ($V_{IN}$) supplied from the power source 104 changes. For example, as the power source 104 is discharged such that the voltage ($V_{IN}$) supplied from the power source decreases, the slope of the variable ramp control signal 210 is decreased, thereby increasing the "on" time of the switch 110. Conversely, as the power source 104 is recharged such that the voltage ($V_{IN}$) supplied from the power source increases, the slope of the variable ramp control signal 210 is increased, thereby decreasing the "on" time of the switch 110.

In one embodiment, the change in slope of the variable ramp control signal 210 is based on the magnitude of the RMS voltage across resistor 106 supplied from the power source 104 at minimum and maximum $V_{IN}$ conditions. In another embodiment, the change in slope of the variable ramp control signal 210 is based upon a best least squares fit to the magnitude of the RMS voltage across resistor 106 supplied from the power source 104 at multiple $V_{IN}$ conditions.

The output RMS PWM control signal 108 from the comparator 208 is a PWM signal that controls the switch 110. The control signal 108 is an RMS compensated signal that results in a substantially constant value of power to the heating resistor 106 for varying values of the magnitude of the input voltage ($V_{IN}$) supplied from the power source 104. Accordingly, the RMS PWM controller 100 closes the switch 110 to couple the power source 104 to the heating resistor 106 and opens the switch 110 to decouple the heating resistor 106 from the power source 104 in accordance with the RMS PWM control signal 108.

Figure 3:
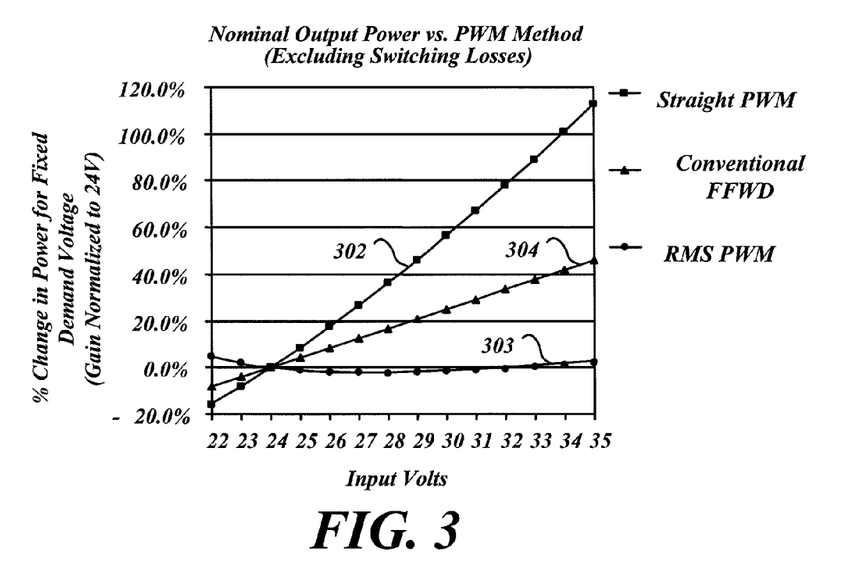
FIG. 3 illustrates hypothetical plots of the percent change in power over a fixed input voltage for a conventional PWM controller, for a standard feed forward (FFWD) PWM controller, and for an RMS PWM controller.

FIG. 3 illustrates hypothetical plots of the percent change in power over a fixed demand voltage for a conventional PWM controller (plot 302), for a conventional feed forward (FFWD) PWM controller (plot 304), and for an RMS PWM controller 100 (plot 306). The plot 302 for the conventional PWM controller illustrates the extreme variation in power as the input voltage varies in an undesirable manner for this conventional controller. Plot 304 for the conventional FFWD PWM controller indicates that some amount of correction can be achieved. However, the variation in power as the input voltage varies is still substantial for this conventional controller.

Embodiments of the RMS PWM controller 100 provide substantially the same amount of power as the input voltage varies, as illustrated in the plot 303. That is, the RMS power to the heating resistor 106 provided by embodiments of the RMS PWM controller 100 is substantially constant over the range of the magnitude of the input voltages ($V_{IN}$) supplied from the power source 104.

Figure 4:
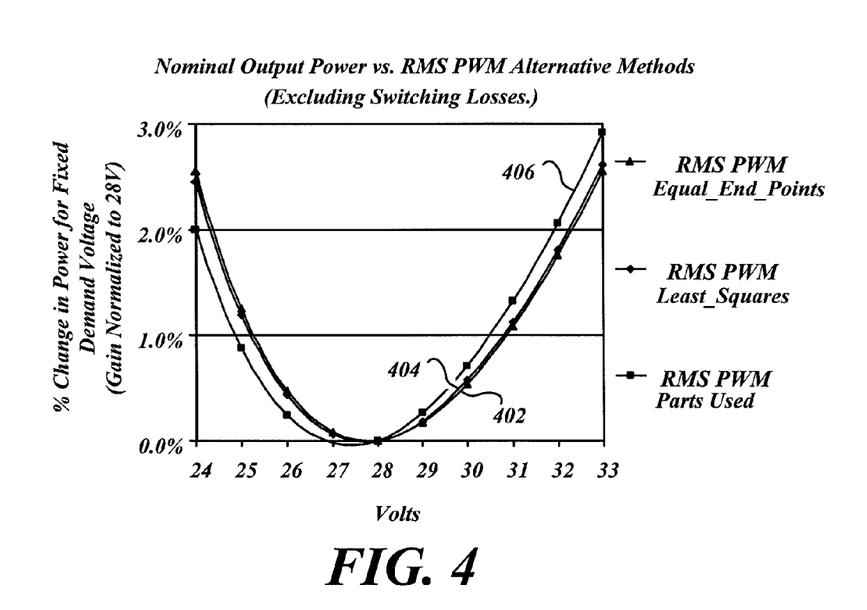
FIG. 4 illustrates hypothetical plots of the percent change in power over a fixed input voltage, normalized to 28 volts, for alternative embodiments of an RMS PWM controller.

FIG. 4 illustrates hypothetical plots of the percent change in power over a fixed input voltage for alternative embodiments of an RMS PWM controller 100. The plot 402 illustrates the effect of using equal end points (the same RMS output power for $V_{MAX}$ and $V_{MIN}$ supplied from the power source 104) to determine the change in slope of the variable ramp control signal 210 output from the variable slope clock 204 (FIG. 2). In this embodiments, only the value of RMS PWM control when the magnitude of the input voltage ($V_{IN}$) supplied from the power source 104 is at its maximum ($V_{MAX}$), and when the magnitude of the input voltage ($V_{IN}$) supplied from the power source 104 is at its minimum ($V_{MIN}$), is used to determine the slope.

The plot 404 illustrates the effect of a best least square fit to determine the change in slope with $V_{IN}$. The plot 406 illustrates the effect of using available high grade components in the circuitry of the RMS PWM controller 100. The available component values were chosen to skew the high line power out to be greater than the low line power out to correct for higher switching losses in the switch 110 at high line.

Figure 5:
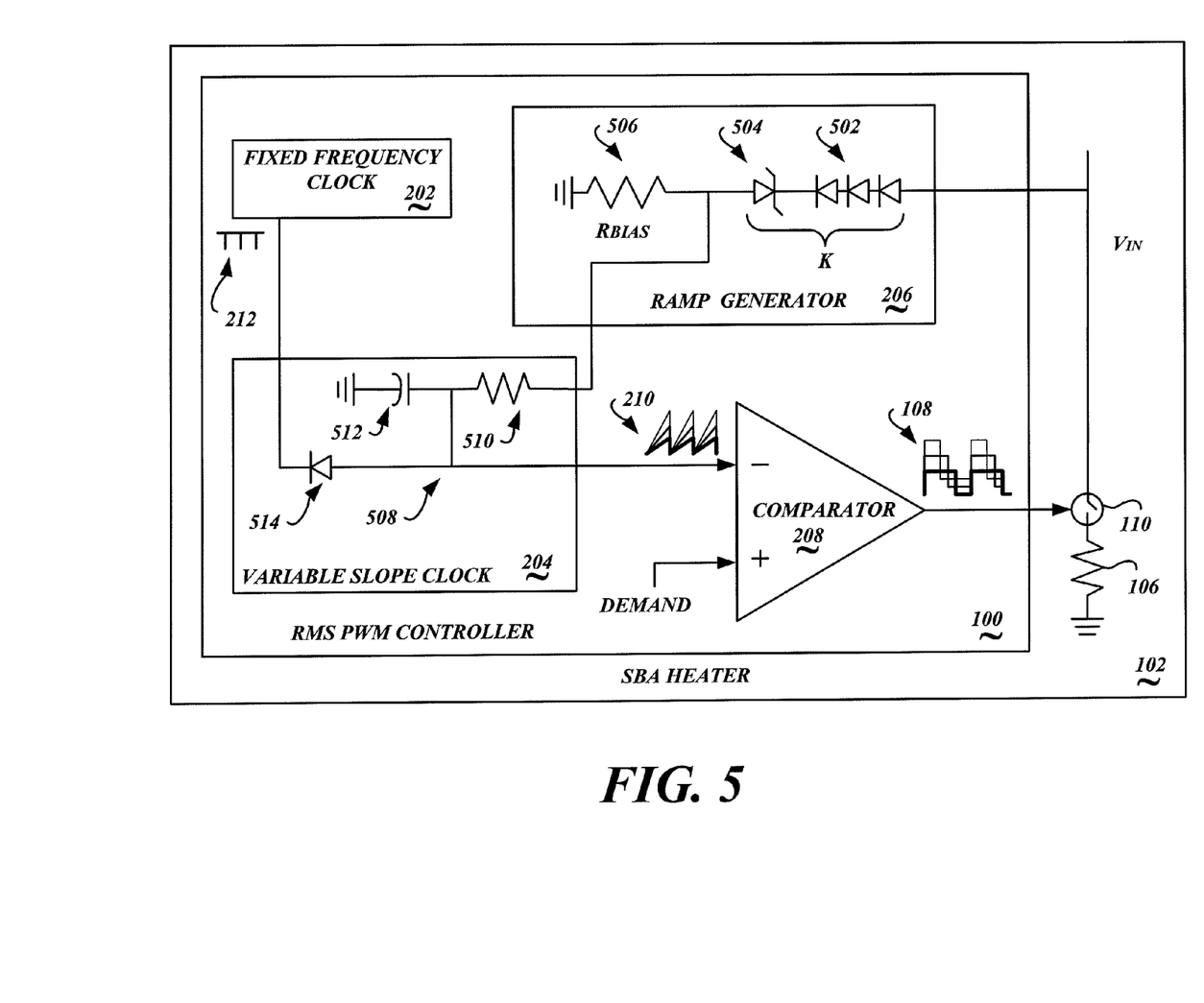
FIGS. 5-9 are block diagrams of implementing various embodiments of the RMS PWM controller.
Figure 6:
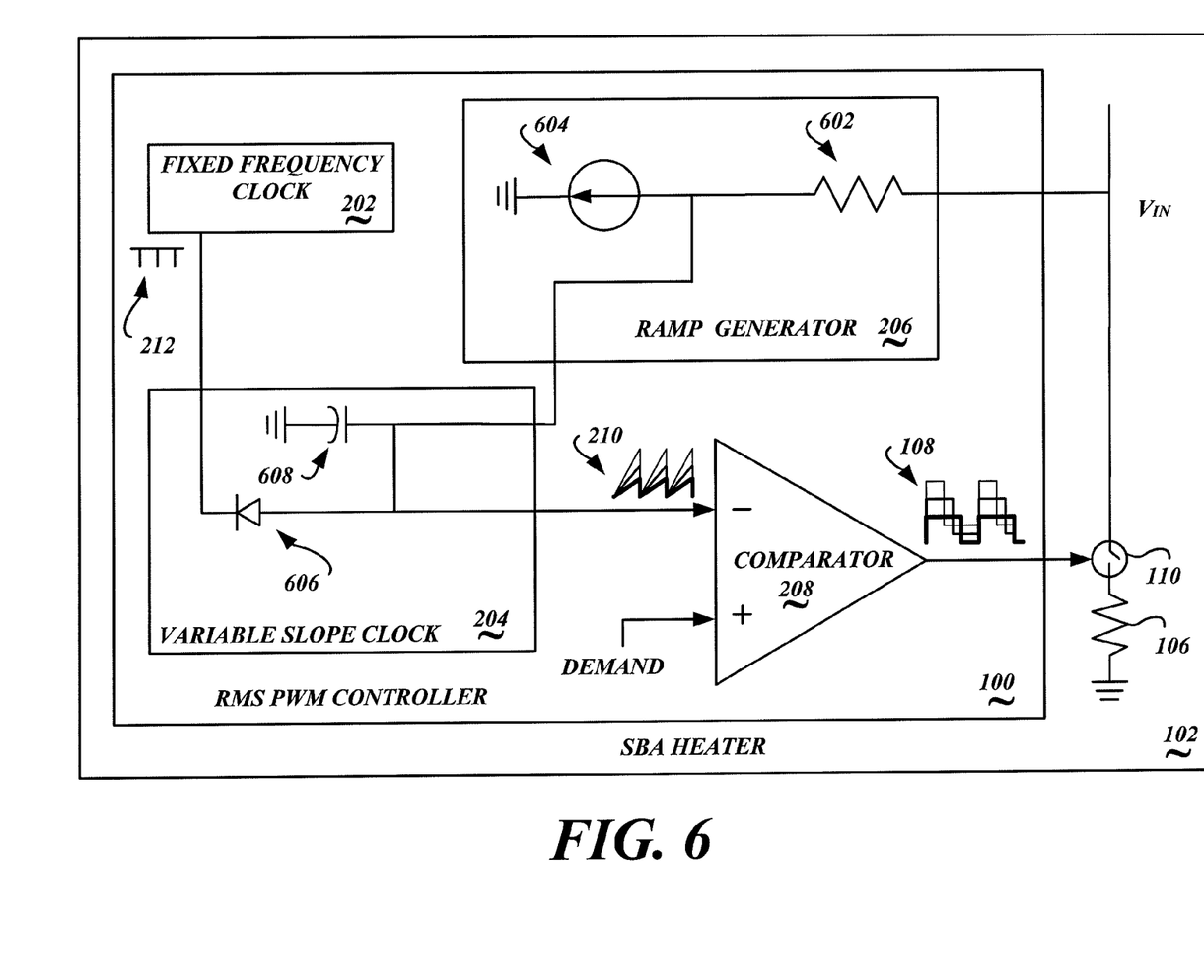
Figure 7:
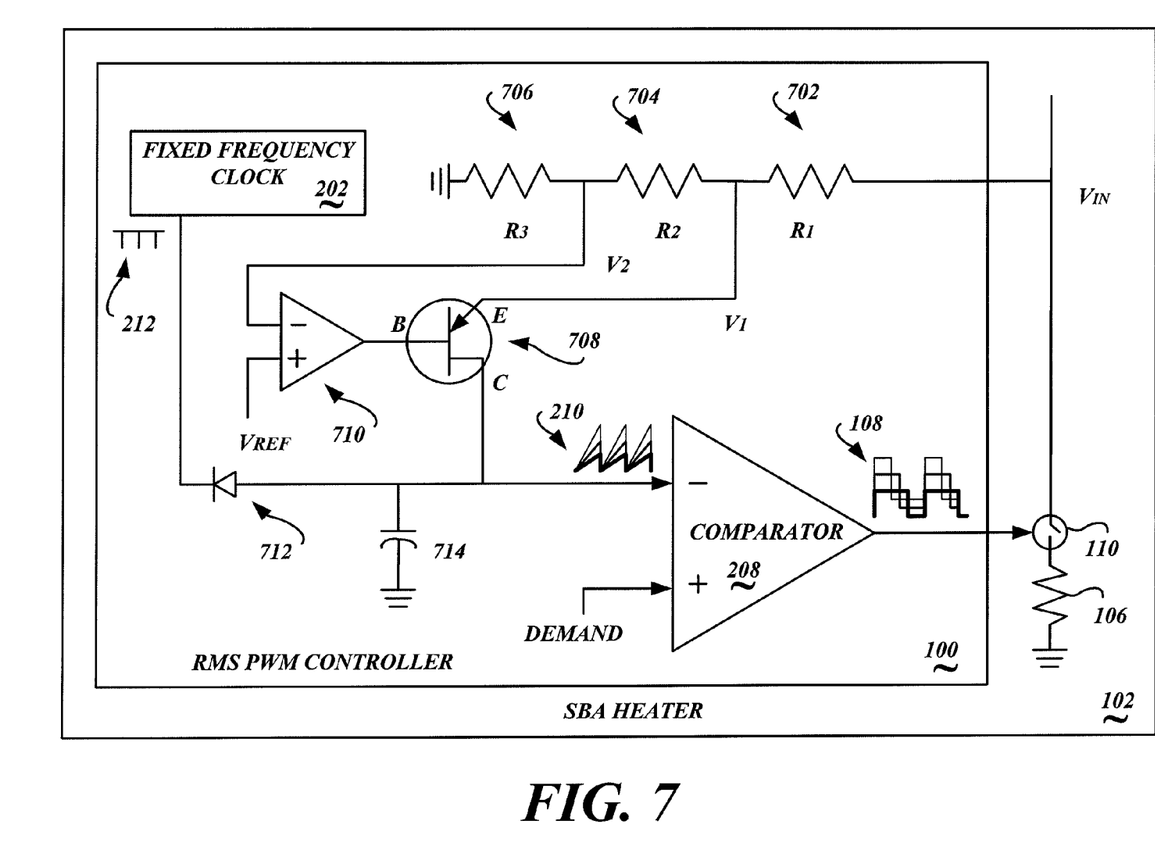

FIGS. 5-7 are block diagrams of implementing various embodiments of the RMS PWM controller. In FIG. 5, a plurality of diodes 502 (three are illustrated for convenience), a zener diode 504 (or a temperature compensated zener diode or the equivalent), and a bias resistor 506, are in series with the power source 104. An RC circuit 508 (that includes a resistor 510 and a capacitor 512) generates the variable ramp control signal 210. The clock control signal 212 resets the ramp value by biasing the diode 514. The offset voltage (K) equals the voltages of the diodes 502 plus the voltage of the zener diode 504. The diodes 502 may be selected to provide temperature compensation for the zener diode 504.

In FIG. 6, a resistor 602 is in series with a current controller 604. The amount of current $I_{OFFSET}$ drawn by the current controller 604 induces a voltage drop across the resistor 602. The voltage drop across the resistor 602 form $I_{OFFSET}$ corresponds to the voltage offset K. The RC circuit made by resistor 602 and capacitor 608, with an offset made by the current source 604, generates the variable ramp control signal 210. The clock control signal 212 resets the ramp value by biasing the diode 606.

In FIG. 7, a fixed voltage is subtracted from the input voltage $V_{IN}$ to generate a current source that feeds the variable slope clock 204. Three resistors 702, 704, and 706 are used as a voltage divider circuit. The voltage $V_1$ between the first resistor 702 and the second resistor 704 is fed into an emitter of the PNP transistor 708. The voltage $V_2$ between the second resistor 704 and the third resistor 706 is fed into a first input of the operational amplifier 710. A reference voltage is input to a second input of the operational amplifier 710. The output of the operational amplifier 710 is fed into the base of the PNP transistor 708. The current flowing through the resistor 702 into the emitter of the transistor 708 generates a linear ramp on capacitor 714. The slope on this ramp is proportional to the input voltage $V_{IN}$ less a constant which generates the variable ramp control signal 210. The clock control signal 212 resets the ramp value by biasing the diode 712.

In alternative embodiments, other suitable transistors may replace the PNP transistor 708, along with such other circuitry as required, to generate the variable ramp control signal 210. For example, a NPN transistor may be used in an alternative embodiment.

Figure 8:
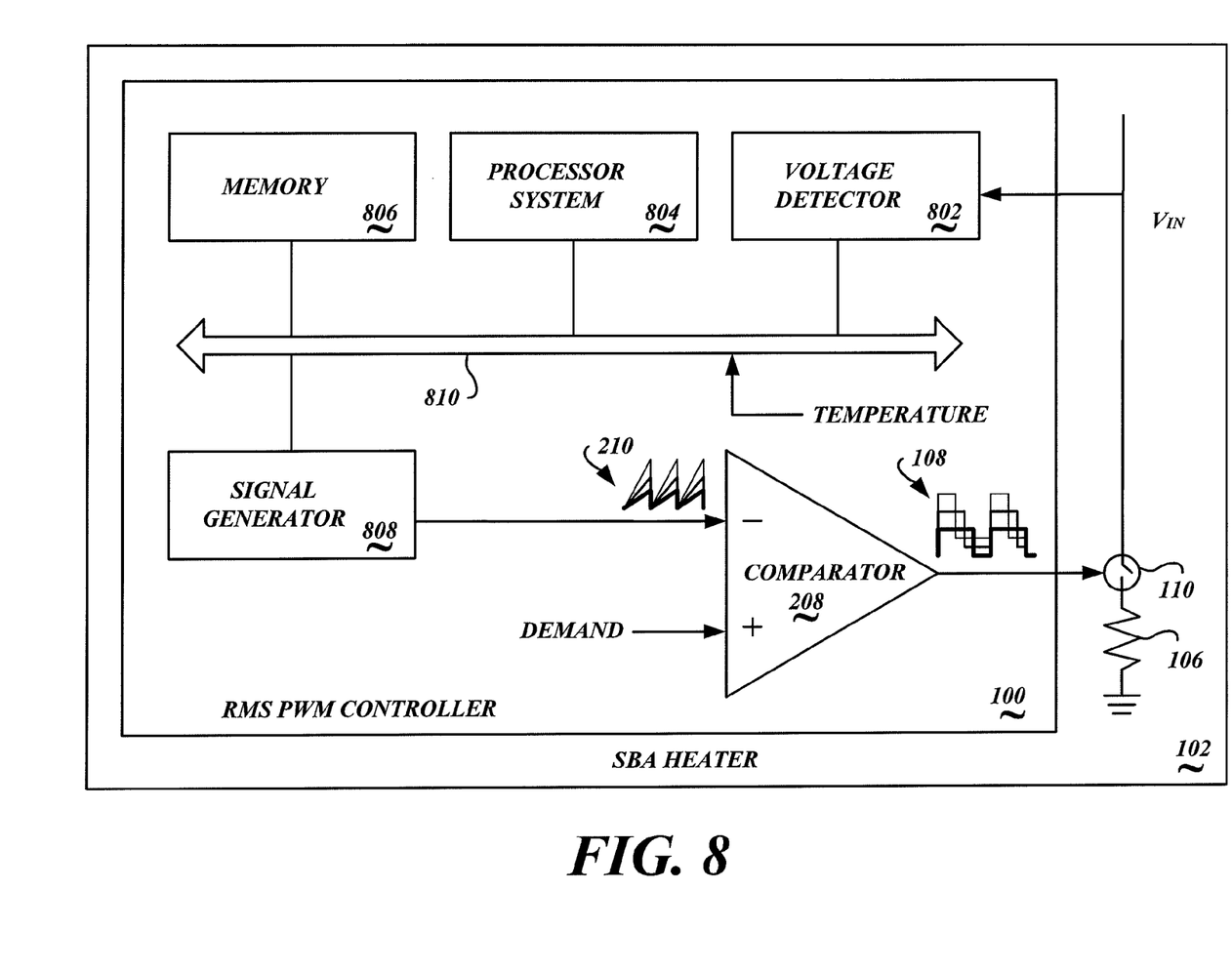

FIG. 8 illustrates a processor based embodiment of the RMS PWM controller 100. This embodiment includes a voltage detector 802, a processor system 804, a memory 806, and a signal generator 808. The above described components are communicatively coupled together via a communication bus 810. Other components, not illustrated, may be included. In alternative embodiments of the processor based RMS PWM controller 100, the above-described components may be communicatively coupled to each other in a different manner. For example, one or more of the above-described components may be directly coupled to the processor system 804, or may be coupled to the processor system 804 via intermediary components (not shown). In alternative embodiments, the variable ramp control signal 210 is provided to a comparator that is external to the RMS PWM controller 100. The components may be fabricated together on a single silicon chip, and/or may be implemented as separate components in communication with each other.

The voltage detector 802 detects the input voltage $V_{IN}$ and generates a digital signal corresponding to the detected input voltage $V_{IN}$ that is communicated to the processor system 804. The processor system 804 receives the digital signal corresponding to the magnitude of the input voltage $V_{IN}$, and a signal corresponding to sensed temperature. The processor system 804 executes logic residing in memory 806 and generates a digital control signal that is communicated to the signal generator 808. The signal generator 808 generates the variable ramp control signal 210 that is input to the comparator 208.

In an alternative embodiment, the signal generator 808 may generate the RMS PWM control signal 108 directly, thereby controlling the switch 110. In another embodiment, the signal generator 808 may generate a signal corresponding to the output of the ramp generator 206.

In some embodiments, the value of the offset voltage K varies as the magnitude of the input voltage $V_{IN}$ varies. That is, different offset voltages K may be used for different values or ranges of $V_{IN}$. In a processor based embodiment, information corresponding to a plurality of different offset voltages used for different input voltages $V_{IN}$ may reside in memory 806 (FIG. 8). Further, information may be saved in the memory 806 to define any suitable variable ramp control signal 210 and/or RMS PWM control signal 108.

Figure 9:
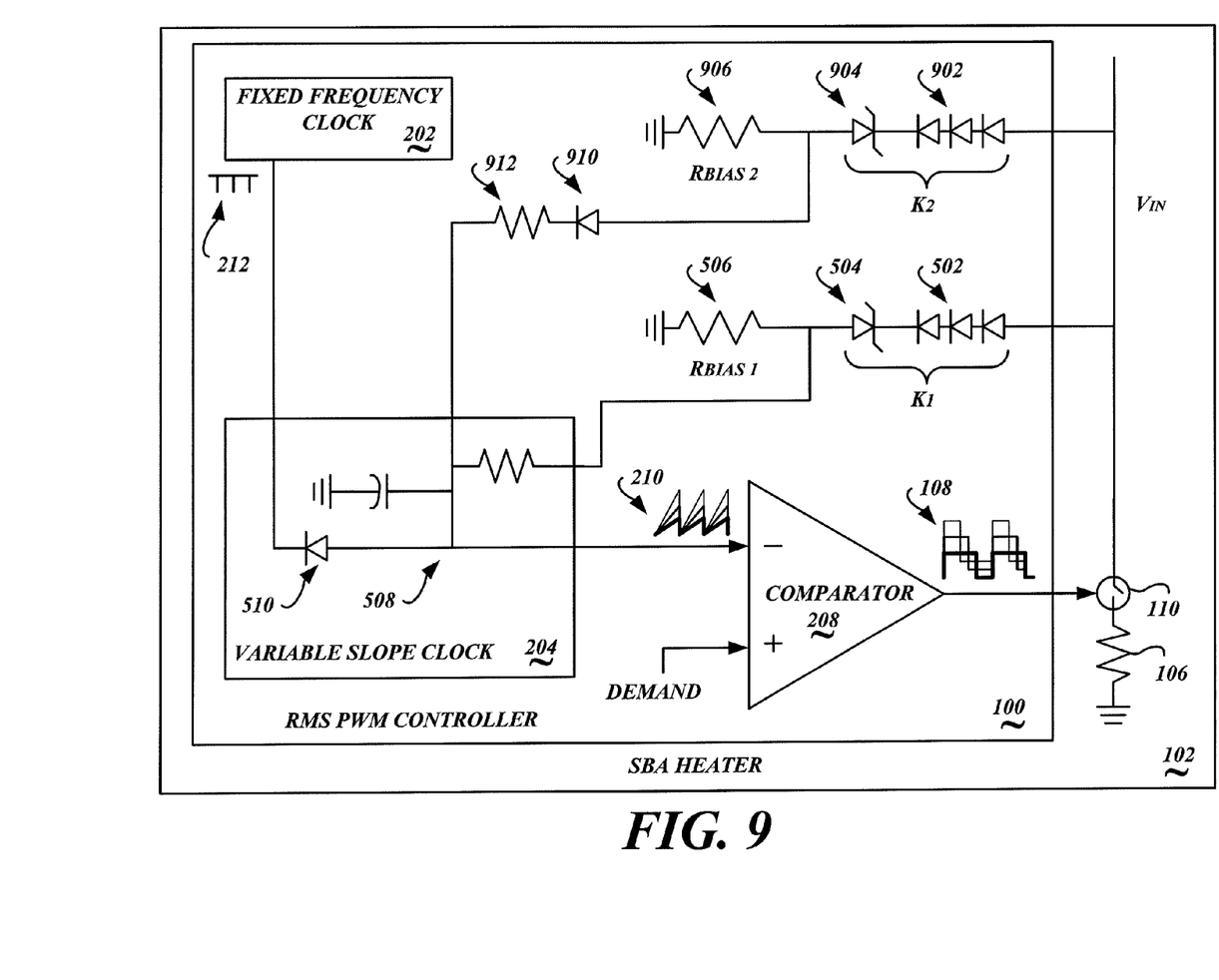

In an alternative embodiment where the offset voltage K varies as the input voltage $V_{IN}$ varies, a plurality of diode groups may be used to generate a plurality of different offset voltages K. FIG. 9 illustrates a second plurality of diodes 902 (three are illustrated for convenience), a second zener diode 904 (or a temperature compensated zener diode or the equivalent) and a second bias resistor 906 ($R_{BIAS}$ 2), are in series with the power source 104. Here, a second offset voltage ($K_2$) equals the voltages of the diodes 902 plus the voltage of the zener diode 904. A diode 910 and a resistor 912 control at what range of the magnitude of the voltages $V_{IN}$ the second voltage offset $K_2$ is effective for defining the variable ramp control signal 210. Additional diode groups may be used to define additional offset voltages ($K_i$) for different predefined ranges of the magnitude of the input voltage ($V_{IN}$) supplied from the power source 104.

In alternative embodiments, the variable slope clock 204 may be any type of device or circuitry, alone or in combination with the fixed frequency clock 202, that generates a variable slope, saw-tooth like output corresponding to the slope of the output variable ramp control signal 210. That is, alternative circuitry which generate the variable ramp control signal 210, and/or the clock control signal 212, may be used in alternative embodiments. Such circuitry used in alternative embodiments is generically referred to as a "clock" or the like for convenience.

In alternative embodiments, a voltage detector or sensor detects, or senses, the magnitude of the input voltage ($V_{IN}$) supplied from the power source 104. In such alternative embodiments, the detected or sensed voltage is provided to the ramp generator 206, or its equivalent, such that the variable ramp control signal 210 is generated.

Various exemplary embodiments above are described as controlling a sensor block assembly (SBA) heater. Other embodiments of the RMS PWM controller 100 may be configured to control other devices. For example, the power to a light may be controlled by an alternative embodiment. As another non-limiting example, an embodiment of the RMS PWM controller 100 may control the power to a heater used in a chemical process to control temperature of a chemical or mixture, or control temperature of a component handling the chemical or mixture. In another non-limiting embodiment, the temperature of a component of a measuring system may be controlled.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A method for sourcing a heater, the method comprising:
   generating a ramping signal;
   generating a fixed frequency clocking signal;
   generating a variable ramp control signal from the ramping signal and the fixed frequency clocking signal, wherein a frequency of the variable ramp control signal is controlled by the fixed frequency clocking signal, and wherein a slope of the variable ramp control signal is controlled by the ramping signal;
   generating a root mean square (RMS) pulse width modulation (PWM) control signal based upon the variable ramp control signal, wherein the variable ramp control signal is based on an input voltage from a power source;
   controlling a switch in accordance with the RMS PWM control signal;
   wherein the RMS PWM control signal controls the switch to provide power to the heating resistor at a first duty cycle corresponding to the magnitude of a first input voltage, wherein the slope of the variable ramp control signal is set to a first value corresponding to the first input voltage while at the first duty cycle;
   wherein the RMS PWM control signal controls the switch to provide power to the heating resistor at a second duty cycle corresponding to the magnitude of a second input voltage distinct from the first input voltage, wherein the slope of the variable ramp control signal is set to a second value distinct from the first value and corresponding to the second input voltage while at the second duty cycle;
   sourcing a heater resistor from the power source in accordance with the controlling of the switch; and
   wherein power to the heating resistor is controlled by the switch to provide a substantially constant value of power to the heating resistor for varying values of the input voltage, wherein varying the slope of the variable ramp control signal between the first duty cycle and the second duty cycle causes the power provided to the heating resistor at the first duty cycle to be substantially the same as the power provided to the heating resistor at the second duty cycle.

2. The method of claim 1, further comprising:
   enabling the fixed frequency clocking signal with a demand signal, wherein the RMS PWM control signal corresponds to the generated variable ramp control signal when enabled.

3. The method of claim 1, wherein generating the RMS PWM control signal further comprises:
   setting the slope of the variable ramp control signal in accordance with the input voltage,
   wherein the first input voltage is at a maximum magnitude of the input voltage, and
   wherein the second input voltage is at a minimum magnitude of the input voltage, the second value less than the first value.

4. The method of claim 1, further comprising:
   decreasing the slope of the variable ramp control signal as the input voltage decreases.

5. The method of claim 1, wherein the heater is a sensor block assembly (SBA) heater.

6. The method of claim 1, wherein the slope of the variable ramp control signal is proportional to the magnitude of the input voltage less a constant.

7. The method of claim 1, wherein controlling the switch comprises:
   closing the switch to couple the power source to the heating resistor; and
   opening the switch to decouple the heating resistor from the power source,
   wherein the closing and the opening is in accordance with the RMS PWM control signal.

8. The method of claim 1, further comprising:
   sensing temperature; and
   enabling control of the switch to source the heating resistor when the sensed temperature is less than a predefined threshold.

9. A system that sources a heater, comprising:
   a heating resistor;
   a switch coupled between a power source and the heating resistor, the switch configured to source the heating resistor at an input voltage from the power source; and
   a root mean square (RMS) pulse width modulation (PWM) controller coupled to the switch, wherein the RMS PWM controller is configured to generate a RMS PWM control signal to control the switch, wherein the RMS PWM controller includes:
   a ramp generator operable to generate a ramping signal;
   a first clock operable to generate a fixed frequency clocking signal;
   a second clock operable to generate a variable ramp control signal from the ramping signal and the fixed frequency clocking signal, wherein a frequency of the variable ramp control signal is controlled by the fixed frequency clocking signal, and wherein a slope of the variable control signal is controlled by the ramping signal;
   wherein the RMS PWM control signal operates the switch to provide power to the heating resistor at a first duty cycle corresponding to the magnitude of a first input voltage, wherein the slope of the variable ramp control signal is set to a first value corresponding to the first input voltage while at the first duty cycle;
   wherein the RMS PWM control signal operates the switch to provide power to the heating resistor at a second duty cycle corresponding to the magnitude of a second input voltage distinct from the first input voltage, wherein the slope of the variable ramp control signal is set to a second value distinct from the first value and corresponding to the second input voltage while at the second duty cycle; and wherein varying the slope of the variable ramp control signal between the first duty cycle and the second duty cycle causes the power provided to the heating resistor at the first duty cycle to be substantially the same as the power provided to the heating resistor at the second duty cycle.

10. The system of claim 9, further comprising:
a temperature sensor operable to sense temperature of a sensor block assembly, wherein the switch couples the heating resistor to the power source in accordance to the RMS PWM control signal when the sensed temperature falls below a predefined threshold.

11. The system of claim 9, wherein the ramping signal is reset by the second clock.

12. The system of claim 9, wherein the ramp generator comprises:
a plurality of first diodes;
a zener diode in series with the plurality of first diodes; and
a bias resistor in series with the plurality of first diodes and the zener diode,
wherein a voltage offset corresponding to a sum of the voltages across the plurality of first diodes and the zener diode defines the slope of the variable ramp control signal.

13. The system of claim 9, wherein the ramp generator comprises:
a first resistor;
a second resistor in series with the first resistor;
a third resistor in series with the first resistor and the second resistor;
a transistor with an emitter coupled between the first resistor and the second resistor; and
an amplifier with a first input coupled between the second resistor and the third resistor, a second input coupled to a voltage reference, and an output coupled to a base of the transistor.

14. The system of claim 9, wherein the heater is a sensor block assembly (SBA) heater.

15. The system of claim 9, wherein the ramp generator comprises:
a resistor; and
a current controller in series with the resistor;
wherein a voltage offset corresponding to a voltage drop across the resistor induced by a current drawn by the current controller defines the slope of the variable ramp control signal.

16. The system of claim 9, wherein the RMS PWM controller comprises:
a processor system operable to generate the RMS PWM control signal based upon the magnitude of the input voltage.

17. The system of claim 9, further comprising:
a voltage detector communicatively coupled to the processor system and operable to detect the magnitude of the input voltage, and further operable to communicate information corresponding to the magnitude of the detected input voltage to the processor system.

18. The system of claim 9, wherein the ramp generator comprises:

a first plurality of diodes;
a first zener diode in series with the first plurality of diodes;
a first bias resistor in series with the first plurality of diodes and the zener diode;
a second plurality of diodes;
a second zener diode in series with the second plurality of diodes;
a second bias resistor in series with the second plurality of diodes and the zener diode;
wherein a first voltage offset corresponding to a first sum of voltages across the first plurality of diodes and the first zener diode and a second voltage offset corresponding to a second sum of voltages across the second plurality of diodes and the second zener diode define the slope of the variable ramp control signal.

19. A system that sources a heater, comprising:
means for generating a ramping signal;
means for generating a fixed frequency clocking signal;
means for generating a variable ramp control signal from the ramping signal and the fixed frequency clocking signal, wherein a frequency of the variable ramp control signal is controlled by the fixed frequency clocking signal, and wherein a slope of the variable ramp control signal is controlled by the ramping signal;
means for sourcing a heater resistor at a magnitude of an input voltage with power from a power source;
means for generating a root mean square (RMS) pulse width modulation (PWM) control signal based upon the variable ramp control signal and corresponding to the magnitude of the input voltage; and
means for controlling a switch to source the heating resistor with the power source, wherein the switch is controlled in accordance with the RMS PWM control signal;
wherein the RMS PWM control signal controls the switch to provide power to the heating resistor at a first duty cycle corresponding to the magnitude of the first input voltage, wherein the slope of the variable ramp control signal is set to a first value corresponding to the first input voltage while at the first duty cycle;
wherein the RMS PWM control signal controls the switch to provide power to the heating resistor at a second duty cycle corresponding to the magnitude of a second input voltage distinct from the first input voltage, wherein the slope of the variable ramp control signal is set to a second value distinct from the first value and corresponding to the second input voltage while at the second duty cycle; and
wherein power to the heating resistor is controlled by the switch to provide a substantially constant value of power to the heating resistor for varying values of the magnitude of the input voltage, wherein varying the slope of the variable ramp control signal between the first duty cycle and the second duty cycle causes the power provided to the heating resistor at the first duty cycle to be substantially the same as the power provided to the heating resistor at the second duty cycle.

20. The system of claim 19, further comprising:
means for enabling the generated clock control signal with a demand signal, wherein the RMS PWM control signal corresponds to the generated variable ramp control signal when enabled.

* * * * *

UNITED STATES PATENT AND TRADEMARK OFFICE
CERTIFICATE OF CORRECTION

| | |
|---|---|
| PATENT NO. | : 8,389,908 B2 |
| APPLICATION NO. | : 12/368780 |
| DATED | : March 5, 2013 |
| INVENTOR(S) | : Schwerman |

It is certified that error appears in the above-identified patent and that said Letters Patent is hereby corrected as shown below:

In the Specification

In Column 1, Lines 8-10, replace "The United States Government may have certain rights in the invention." with --The United States Government has certain rights in the invention.--

Signed and Sealed this
Eleventh Day of February, 2014

Michelle K. Lee
*Deputy Director of the United States Patent and Trademark Office*